United States Patent [19]

Johnson et al.

[11] Patent Number: 5,559,719

[45] Date of Patent: Sep. 24, 1996

[54] DIGITALLY CONTROLLED CIRCUIT INTERRUPTER WITH IMPROVED AUTOMATIC SELECTION OF SAMPLING INTERVAL FOR 50 HZ AND 60 HZ POWER SYSTEMS

[75] Inventors: Richard A. Johnson, Murrysville; Joseph C. Engel, Monroeville; Gary F. Saletta, Irwin; Alan B. Shimp, Monroeville, all of Pa.

[73] Assignee: Eaton Corporation, Cleveland, Ohio

[21] Appl. No.: 249,829

[22] Filed: May 26, 1994

[51] Int. Cl.[6] .......................... H02H 3/26; G01R 19/00; H02J 3/00
[52] U.S. Cl. .................. 364/483; 364/492; 324/520; 324/76.11; 361/78; 361/85; 361/87
[58] Field of Search ..................... 364/483, 492; 324/520, 76.11; 361/87, 85, 78

[56] References Cited

U.S. PATENT DOCUMENTS

| | | | |
|---|---|---|---|
| 4,335,437 | 6/1982 | Wilson et al. | 364/483 |
| 4,351,012 | 9/1982 | Elms et al. | 361/96 |
| 4,351,013 | 9/1982 | Matsko et al. | 361/96 |
| 4,377,836 | 3/1983 | Elms et al. | 361/96 |
| 4,428,022 | 1/1984 | Engel et al. | 361/96 |
| 5,224,054 | 6/1993 | Wallis | 364/483 |
| 5,233,538 | 8/1993 | Wallis | 364/483 |
| 5,270,898 | 12/1993 | Elms et al. | 361/96 |
| 5,331,501 | 7/1994 | Shimp | 361/94 |
| 5,391,982 | 2/1995 | Kim | 324/76 |
| 5,428,495 | 6/1995 | Murphy et al. | 361/85 |

FOREIGN PATENT DOCUMENTS 4047275  2/1992  Japan .................. G01R 23/15

*Primary Examiner*—James P. Trammell
*Assistant Examiner*—Hien Vo
*Attorney, Agent, or Firm*—Martin J. Moran

[57] ABSTRACT

A circuit interrupter with a digital trip unit automatically sets the sampling interval appropriate for the 50 Hz or 60 Hz distribution system to which the interrupter is connected. In order to avoid falsely shifting the interval in response to distorted currents, the trip unit only changes the interval if the number of zero crossings of the current within a fixed number of samples is within two zero crossings of the number of zero crossings for an undistorted current of the other frequency for two consecutive time periods in which the fixed number of samples are taken. Furthermore, changes in the interval are only written into an EEPROM for use on power-up a fixed number of times to preclude disabling the EEPROM. In one embodiment, a 2 pole filter is utilized in the zero crossing counting circuit to eliminate false counts from noise originating in a chopper used in the trip unit power supply. In another embodiment, the zero crossing counting circuit is disabled unless external dc power is available for the trip unit which idles the chopper.

10 Claims, 11 Drawing Sheets

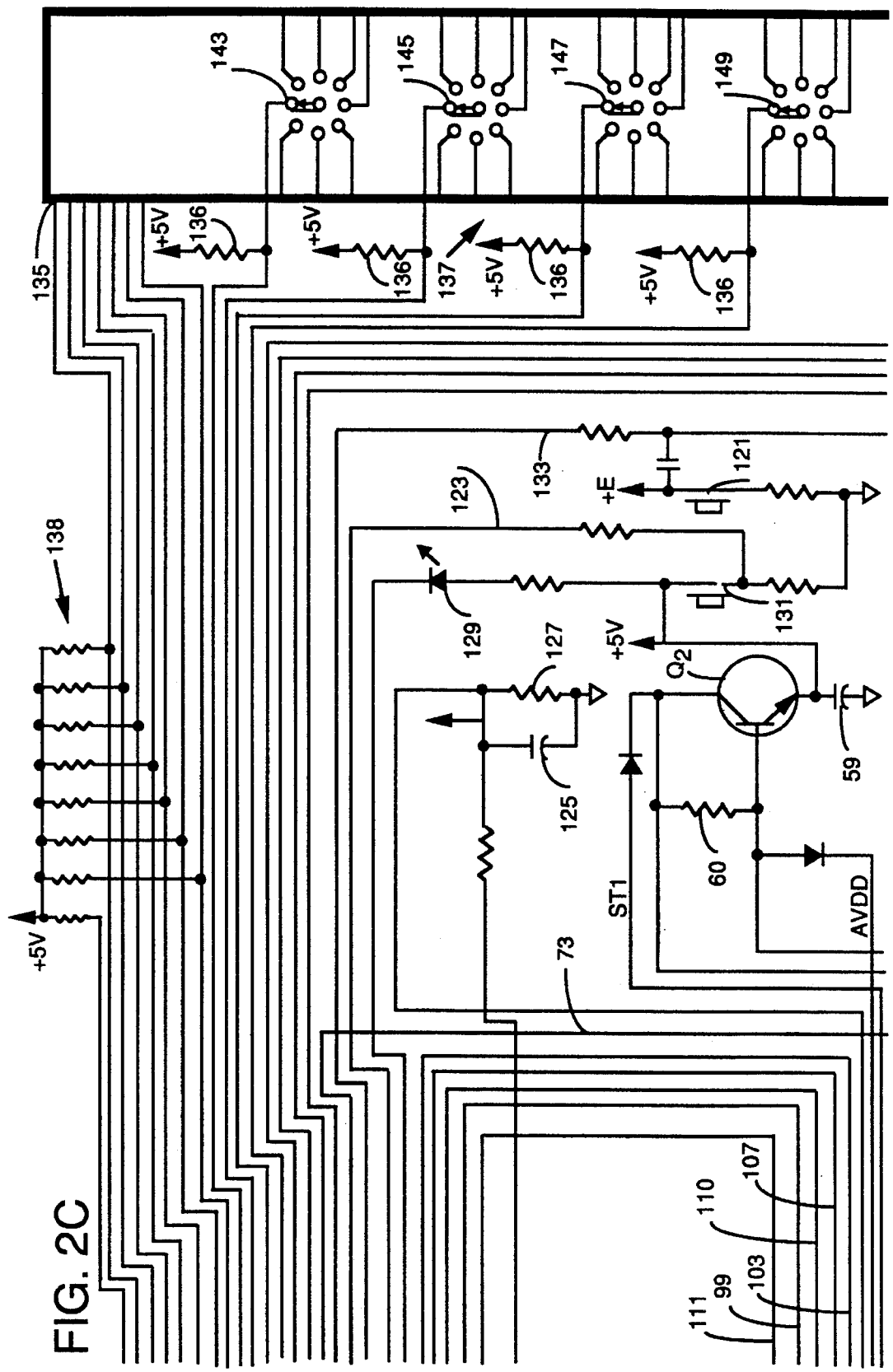

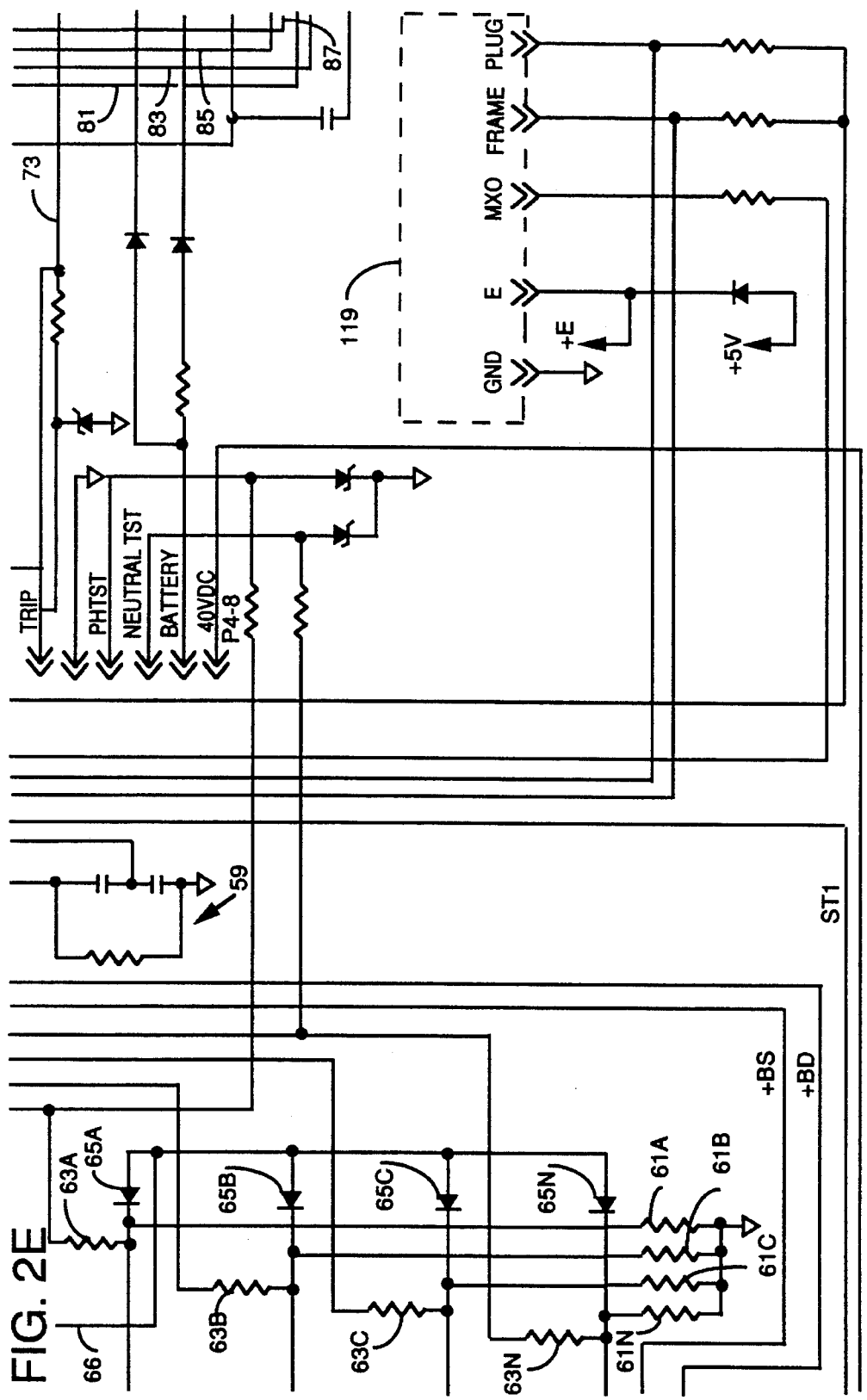

DIGITALLY CONTROLLED CIRCUIT INTERRUPTER WITH IMPROVED AUTOMATIC SELECTION OF SAMPLING INTERVAL FOR 50 HZ AND 60 HZ POWER SYSTEMS

BACKGROUND OF THE INVENTION

1. Field of the Invention

This invention relates to circuit interrupters having digital controls which sample the load current at selected sampling intervals. More particularly, it relates to such digitally controlled circuit interrupters which automatically adjust the sampling interval for 50 Hz and 60 Hz power systems.

2. Background of Information

Many circuit interrupters such as circuit breakers, contactors, motor starters, motor controllers and such, now have digital control systems. Such circuit interrupters digitize the current through the interrupter by sampling it at prescribed intervals. Typically, this sampling interval is fixed at the factory and selected for compatibility with the frequency, either 50 Hz or 60 Hz, of the distribution system with which the interrupter is to be used. With the globalization of markets it has become desirable to provide a circuit interrupter which is easily adaptable for use with either frequency.

U.S. patent application Ser. No. 08/072,376, filed on Jun. 7, 1993, for "Electrical Switching Apparatus with digital Trip Unit and Automatic Frequency Selection" discloses a circuit interrupter with a digital control which automatically sets the digital sampling rate for the 50 Hz or 60 Hz distribution system to which the circuit interrupter is connected. The control system squares up the ac current signal and counts the leading edges of the resultant pulses to generate a count of the zero crossings. If this count is above a reference count, selected as about midway between a count of zero crossings for a 50 Hz signal and a 60 Hz signal during a reference interval, the sampling interval is set for a 60 Hz source. The sampling interval is set to the 50 Hz value if the count is below the reference count. The selected interval is stored in RAM (random access memory) for use by the microprocessor of the digital control and is also stored in an EEPROM (electronically erasable programmable only memory) for use by the microprocessor on start-up following an interruption of control power (typically, the digital control is powered by current in the protected circuit, so that control power is lost and with it values stored in RAM when the circuit interrupter is turned off or trips).

The above automatic selection of the sampling interval works well for 50 Hz and 60 Hz systems in which the current waveform is uncorrupted. However, many loads today, such as for example inverter based speed controls for ac motors, generate harmonics in the load current. These harmonics generate additional zero crossings which produce a false count in the automatic frequency selector. The problem arises when the circuit interrupter is used with a 50 Hz system as the extra counts will falsely result in selection of the interval for a 60 Hz system. As the problem can be intermittent, the interval switches back and forth between that for 50 and 60 Hz. The repeated change in the sampling interval may not result in unacceptable inaccuracies in the protection functions; however, it will probably produce unacceptable power and energy calculations, if generated, as in some circuit interrupters.

Another problem created by random switching between the two intervals for digital sampling of the current is that EEPROMs can only be written over a limited number of times, such as for instance 10,000 times. The entire EEPROM can become inoperable when this number of rewrites is reached, thus disabling other features of the control system having parameters stored in the EEPROM. The digital control of the above mentioned circuit interrupter has a custom integrated circuit chip (IC) described in U.S. Pat. No. 5,270,898 which has a shunt regulated power supply incorporating a chopper. This chopper can create noise which generates a false count of zero crossings in the automatic interval selector of the digital control, and ultimately, this can also lead to excessive rewrites of the digital sampling interval in the EEPROM.

There is a need, therefore, for an improved circuit interrupter for use with either a 50 Hz or a 60 Hz power distribution system.

More particularly, there is a need for such a circuit interrupter with a digital control which automatically selects an appropriate digital sampling rate for the frequency of the connected power source, but which is insensitive to the extraneous zero crossings of a distorted load current waveform.

There is a further need for such a circuit interrupter which does not generate extraneous rewrites for an EEPROM used to store the selected digital sampling interval.

There is also a need for such a circuit interrupter which is protected from false operation if the interrupter has a shunt regulated power supply which incorporates a chopper.

SUMMARY OF THE INVENTION

These and other needs are satisfied by the invention which is directed to apparatus for connecting a load to either a 50 Hz power source or a 60 Hz power source, and has a digital control and means for setting a selectable interval for generating digital samples of the current for the digital control. This setting means generates a count of zero crossings of the current and changes the selectable sampling interval from a first interval for 50 Hz source to a second interval for a 60 Hz source when the count of zero crossings during a first predetermined time period is within a first preselected number of zero crossings of the number of zero crossings produced by an undistorted 60 Hz source during the first predetermined time period, and which changes the interval from the second interval for a 60 Hz source to the first interval for a 50 Hz source when the count of zero crossings within a second predetermined time period is within a second preselected number of zero crossings of the number of zero crossings produced by an undistorted 50 Hz source during the second predetermined time period. Preferably, the selectable interval is only changed if the count of zero crossings falls within the predetermined number of crossings for two consecutive predetermined time periods. Also preferably the first predetermined time period is the time period in which a predetermined number of samples is taken at the first interval and wherein the second predetermined time period is the period of time in which the same number of samples is taken at the second interval.

When the trip unit includes an EEPROM in which the selected interval is written for use by the digital control upon powering up, means are provided to prevent further writing of the selected interval into the EEPROM after the selected interval has been written into the EEPROM a predetermined number of times in order to avoid disabling of the EEPROM. The interval can still be changed and used by the trip unit, but the change will not be recorded in the EEPROM. Hence, upon start-up following a subsequent power loss to the trip unit, the last interval stored in the EEPROM may or may not be the correct interval. However, if it is not the correct interval, the system will change to the correct interval after two consecutive calculations of the correct interval.

When the trip unit includes a dc power supply with a chopper, a two pole filter is inserted in the zero crossing counting means to filter out noise generated by the chopper. In circuit interrupters which calculate power and energy, in addition to providing protection functions, and where the time delay introduced by the filter would be unacceptable, the means for changing the interval is only operable when an external dc source is available and the chopper is idled.

In particular, the invention is directed to an electrical apparatus for connecting a load to either of a 50 Hz power source and a 60 Hz power source, said apparatus comprising:

separable contacts selectively connecting said load to a selected one of said 50 Hz power source and said 60 Hz power source when closed and disconnecting the load from the selected power source when open;

sensing means sensing current flowing through said separable contacts to the load when said contacts are closed;

digital control means including digitizing means digitally sampling said current sensed by said sensing means at selectable time intervals to generate digital current signals, and means responsive to predetermined values of said digital current signals to generate a trip signal;

means setting said selectable interval either to a first interval for a 50 Hz source or a second interval for a 60 Hz source and comprising zero crossing counting means generating a count of zero crossings of said current and means changing said selectable interval from said first interval to said second interval when said count during a first predetermined time period is within a first preselected number of zero crossings of a first number of zero crossings produced by an undistorted 60 Hz source during said first predetermined time period, and changing said selectable interval from said second interval to said first interval when said count within a second predetermined time period is within a second preselected number of zero crossings of the number of zero crossing produced by an undistorted 50 Hz source during said second predetermined time period; and means responsive to a trip signal to open said contacts.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
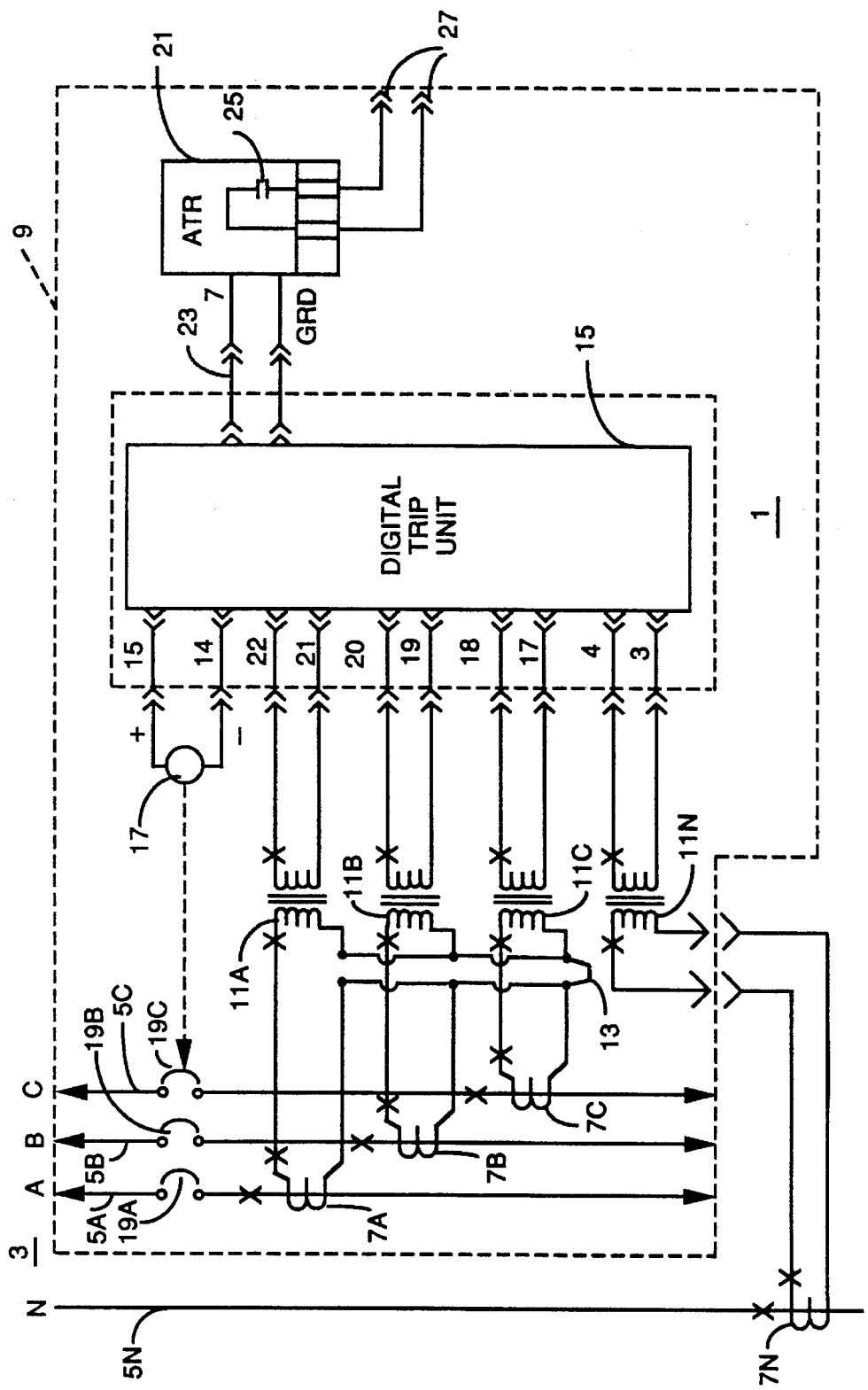
FIG. 1 is a schematic circuit diagram, partially in block diagram form of a circuit interrupter incorporating the invention.

FIG. 1 illustrates a circuit breaker 1 in accordance with the invention connected to provide protection for a three-phase/four-wire electrical system 3. This electrical system has three-phase conductors 5A, 5B, and 5C and a neutral conductor 5N. The circuit breaker 1 has three primary current transformers 7A, 7B, and 7C for sensing current flowing in the respective phase conductors. These primary CT's are physically located inside the housing 9 of the circuit breaker 1. A fourth primary current transformer 7N, external to the circuit breaker 1, monitors current flowing in the neutral conductor 5N. The primary CT's 7 are selected so that the full scale rated current of the electrical system generates on the secondary a 5 ampere signal, for instance. All of the phase primary CT's, 7A–C, are the same size; however, the neutral primary CT 7N can be a different size depending upon the relative size of the neutral conductor 5N to the size of the phase conductors 5A–C. The auxiliary current transformers 11A, B, C, N step down the full scale rated current to, for example, 0.1 amperes. The secondaries of the primary phase CT's are connected at 13.

The two wire outputs of the secondary windings of the current transformers 11A, B, C, N are applied as inputs to a digital trip unit 15. The digital trip unit 15 which is described in FIGS. 2A–2F performs protection functions based on the monitored phase and neutral currents. These protection functions include generating trip signals which actuate a flux shunt trip device 17 to open separable contacts 19A, 19B, and 19C in the phase conductors 5A–C. Where applicable codes permit, a set of contacts (not shown) can also be included in the neutral conductor 5N if desired.

The circuit breaker 1 can also include a relay 21 which may be used to signal an alarm for a phase or neutral overload or a breaker trip. The relay 21 is actuated by a signal on the lead 23 from the digital trip unit 15. The relay 21 closes a set of contacts 25 which provides a contact closure indication at output terminals 27. These terminals 27 may be connected to a remote indicator (not shown).

The circuit breaker 1 provides protection in accordance with known current-time protection characteristics. These protection functions are performed by the trip unit 15 and include an instantaneous trip function, short delay trip function and a long delay trip function. The instantaneous trip function provides protection against short circuits. The short delay trip function allows coordination with other circuit breakers in a distribution system in which the circuit breaker 1 is connected. The short delay trip is generated if current exceed a pick-up value, which is less than the value for the instantaneous trip, for a selected interval of time. The long delay function provides protection from overheating of the conductors of the electrical system due to a persistent excessive current. It therefore typically has an inverse time-current characteristic which approximates the thermal capacity of the electrical system. Long delay protection is initiated if the current exceeds the long delay pick-up level. If the current is less than the short delay and/or instantaneous pick-up level and exists for a period of time which is longer than a time corresponding to the long delay time setting, a long delay trip occurs.

In the exemplary circuit breaker, instantaneous, short delay and long delay protection are provided for the neutral conductor as well as the phase conductors. The pick-up values of the current for these neutral protection functions are scaled to the pick-up values for phase protection, while the time delays for short delay and long delay for phase protection are also used for neutral protection. It is not essential to the present invention that overcurrent protection be provided for the neutral conductor. As an example, the neutral current could be used, as is known, to provide ground fault protection. In fact, the circuit breaker 1 does not need to monitor neutral current at all, if such protection is not desired.

Figure 2:
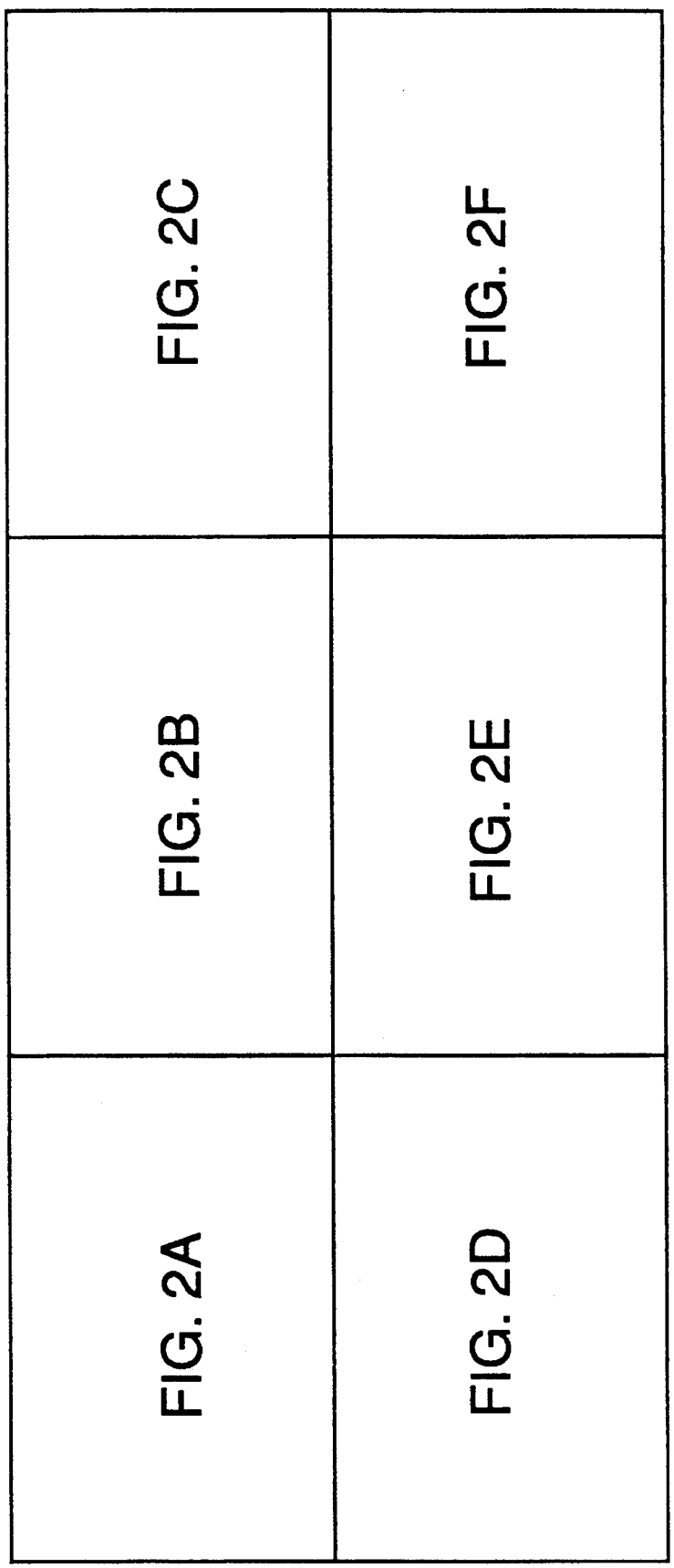
FIGS. 2A–2F, when arranged as shown in the diagram of FIG. 2, form a schematic circuit diagram of the trip unit which forms part of the circuit breaker of FIG. 1.
Figure 2A:
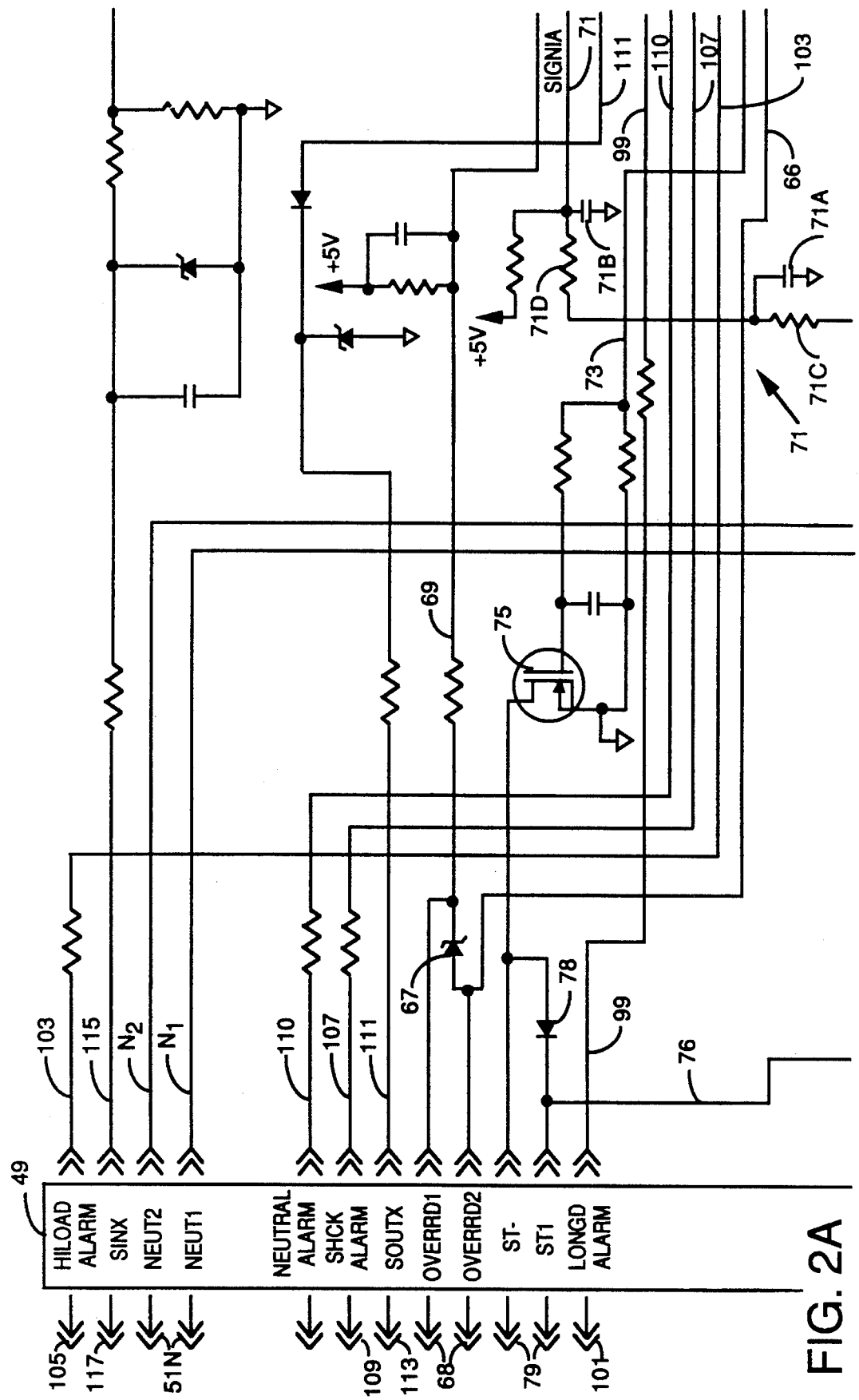
Figure 2B:
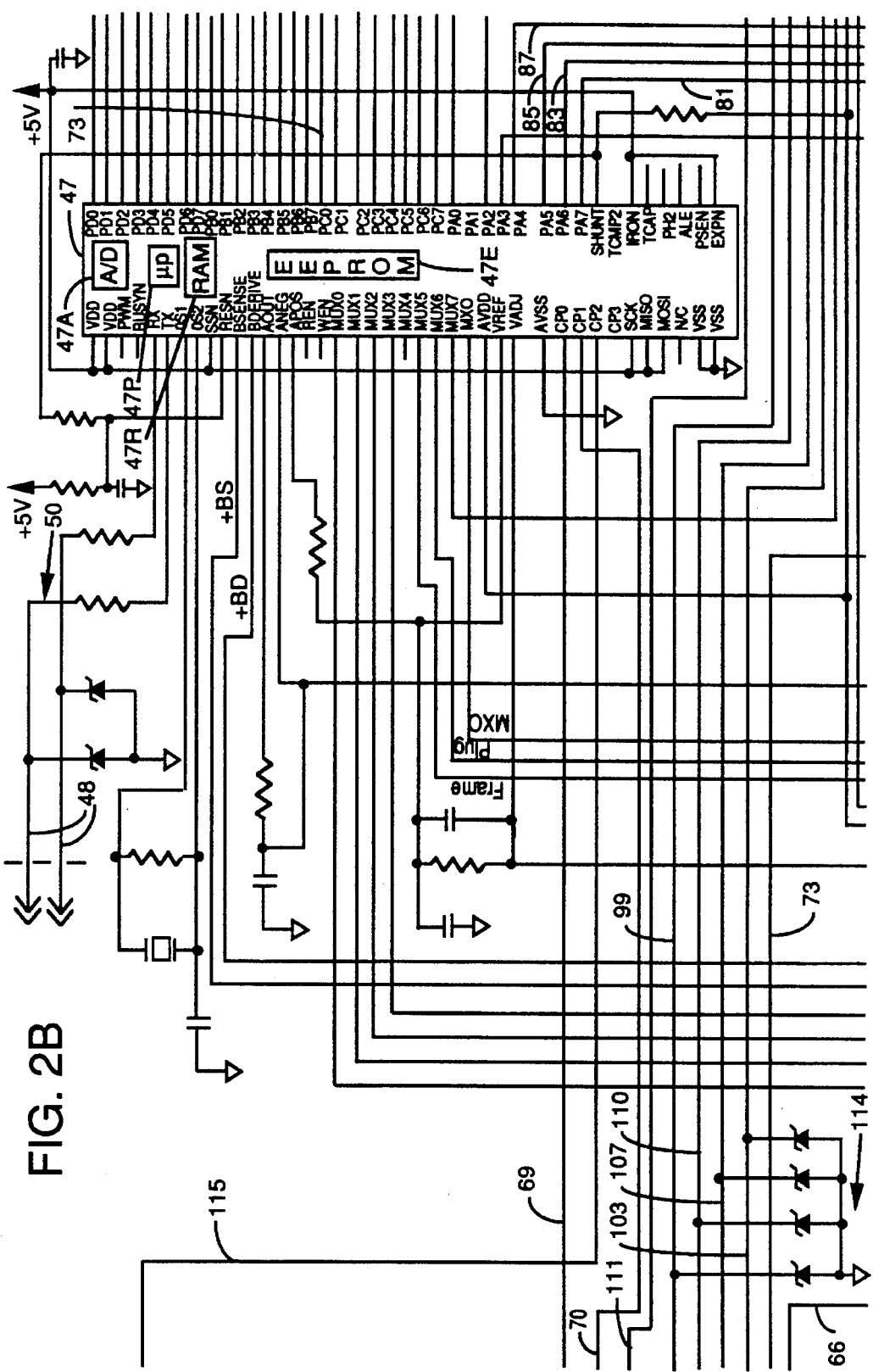
Figure 2D:
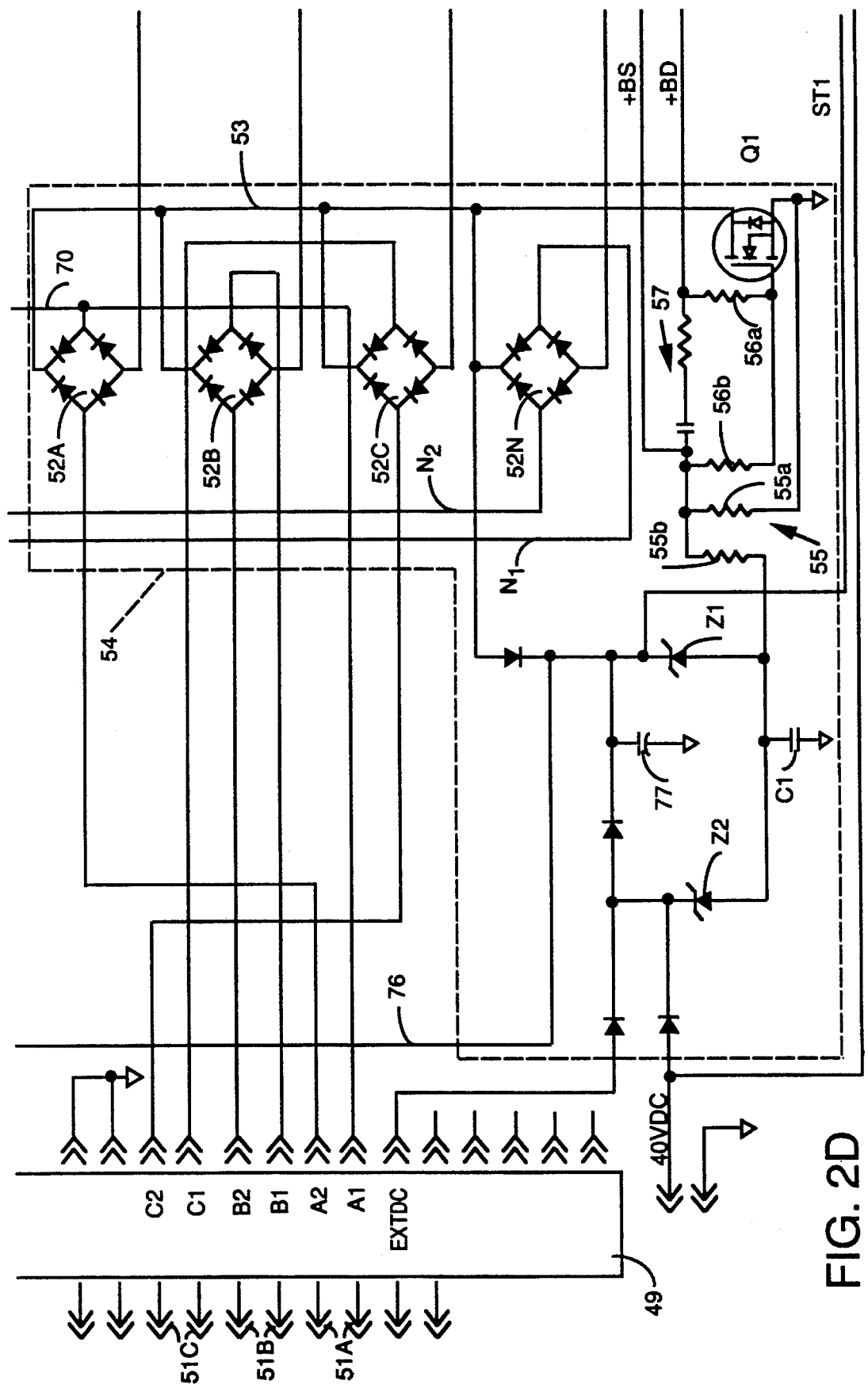
Figure 2F:
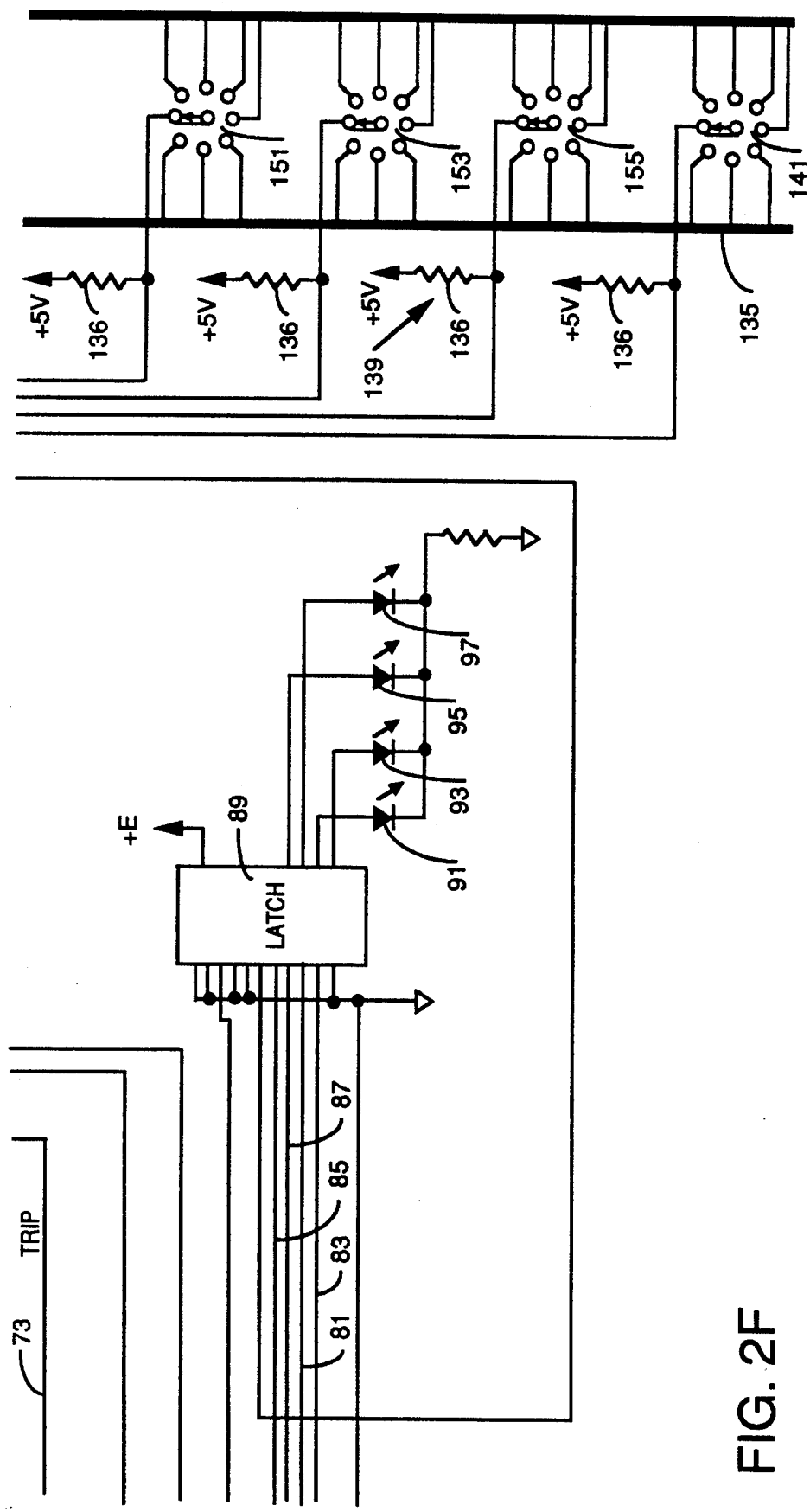

FIGS. 2A–2F when aligned as illustrated in FIG. 2 illustrate a schematic circuit diagram of the digital trip unit 15 of the circuit breaker 1. The heart of the digital trip unit is an integrated circuit (IC) chip 47. This custom chip is a complementary metal oxide semiconductor (CMOS) IC which includes an on-board microprocessor 47P, an analog-to-digital (A/D) subsystem 47A, a RAM 47R, an EEPROM 47E and various input/output devices on a single monolithic chip. The details of this chip are disclosed in U.S. Pat. No. 5,270,898 issued on Dec. 14, 1993 which is hereby incorporated by reference. The IC described in this patent includes circuitry for communication through leads 48 protected by surge protection circuits 50 between the circuit breaker and remote devices (not shown) for remote control and monitoring. While such communications are compatible with the present invention, they are not a necessary part of a circuit breaker in accordance with the invention, and hence will not be discussed herein.

The digital trip unit 15 includes an extender board 49 which plugs into the housing of the circuit breaker for inputting and outputting signals to the digital trip unit. The extender board 49 includes pairs of connections 51A, B, C, N for inputting phase currents and neutral currents from the secondary CT's 11A, B, C, N, respectively. These phase and neutral current signals are rectified by full wave rectifiers 52A, B, C, N. The outputs of the full wave rectifier bridges 52 are applied to a common lead 53 which supplies current to a power supply 54.

The power supply 54 generates a roughly regulated 40 volts dc. The dc currents from the bridges 52 charge a capacitor 77. The voltage on capacitor 77 is controlled by a chopper comprising a FET Q1. The voltage on the capacitor 77 is monitored by a circuit including a 36 volt zener diode Z1, and a voltage divider 55 formed by the resistors 55A and 55B. Thus, when there is 40 volts on capacitor 77, the voltage signal +BS at the center junction of the voltage divider will be 2 volts. The +BS signal is read by the IC 47 (through the BSENSE input) and compared to 2 volts. If +BS is more than 2 volts, meaning the voltage on the capacitor 77 is more than 40 volts, the IC 47 generates a +BD drive signal which flows through resistors 56A and 56B to turn on Q1, thereby shunting the current from the bridges 52 (generated by the CT secondaries) to ground. When the +BS signal falls below 2 volts, Q1 is turned off, and the voltage on capacitor 77 again increases. A capacitor and resistor 57 connected between the leads carrying the +BS and +BD signals introduce time delays in these signals which produce hysteresis to stabilize the operation of Q1.

The 40 volt supply 54 is also used to generate a 5 volt supply for the digital circuits of the IC 47, including the microprocessor 47P. The 40 volt signal ST1 charges a capacitor 59 through a transistor Q2. Q2 is connected as an emitter follower with the base biased by a precision +5 volt signal AVDD generated within the IC 47. U.S. Pat. No. 5,270,898 can be referred to for a description of this precision 5 volt signal which is used as a power supply for the analog circuits of the IC 47. The transistor Q2 and capacitor 59 produce a precision 5 volt dc supply for the digital circuits from the loosely regulated 40 volt supply of the power supply 54.

The trip unit 15 can also be powered from outside dc sources, and in fact, the exemplary trip unit can be supplied from a plug-in charger circuit through the "40 volt" input on pin 8 of plug 4, or through another external source through the "EXTDC" pin on the extender board 49. These auxiliary dc sources charge the capacitor 77 to roughly 40 volts dc. A 20 volt zener Z2 assures that the +BS signal will be well above 2 volts when auxiliary power is being used so that the IC 47 will turn on Q1 and the current from the current transformers 11 will be continuously shunted to ground.

The continual turning on and off of Q1 while the trip unit 15 is powered by the current transformers 11, produces noise, which as will be seen, is coupled into the frequency determining circuitry. However, when auxiliary power is being used, Q1 is on continuously and there is no switching noise to generate false zero crossings which interfere with the frequency determination.

The rectified currents produced by the full wave rectifiers 52A, B, C, N are applied to current sensing resistors 61A, B, C, N, respectively. The sensed currents are read into the IC chip 47 through input resistors 63A, B, C, N. As explained in the referenced patent, these currents are converted to voltages by the analog circuits in the IC 47 and digitized by the on-board A/D converter 47A for input to the microprocessor 47P.

The analog dc currents from the full wave rectifier bridges 52 are also auctioneered through the diodes 65A, B, C, N. If the largest analog current exceeds a value determined by the zener diode 67 to which these diodes are connected by a lead 66, an override trip signal is generated at lead 69. This override signal trips the circuit breaker via IC 47 to avoid the delays that are inherent in the digital circuitry in detecting and responding to overcurrent conditions. It only responds to very large overcurrents such as would be caused, for example, by a bolted short circuit. The override trip is reported to the microprocessor through the lead 69.

The phase A ac current is also applied to the IC 47 as the signal SIGNIA over lead 70 to provide an indication of the sign of the current and is used by the microprocessor in determining the frequency of the currents in the protected system in a manner to be discussed below.

The noise generated by the chopper Q1 in the manner discussed above, if coupled into the signal SIGNIA, distorts the frequency determination by generating false zero crossings. This noise can be suppressed by inserting a 2 pole filter 71 comprising a combination of capacitors 71A, 71B and resistors 71C and D. As the frequency of the noise generated by the chopper Q1 is typically high, the roll-off frequency of the 2 pole filter 71 is selected to eliminate the effect of this noise.

Figure 3:
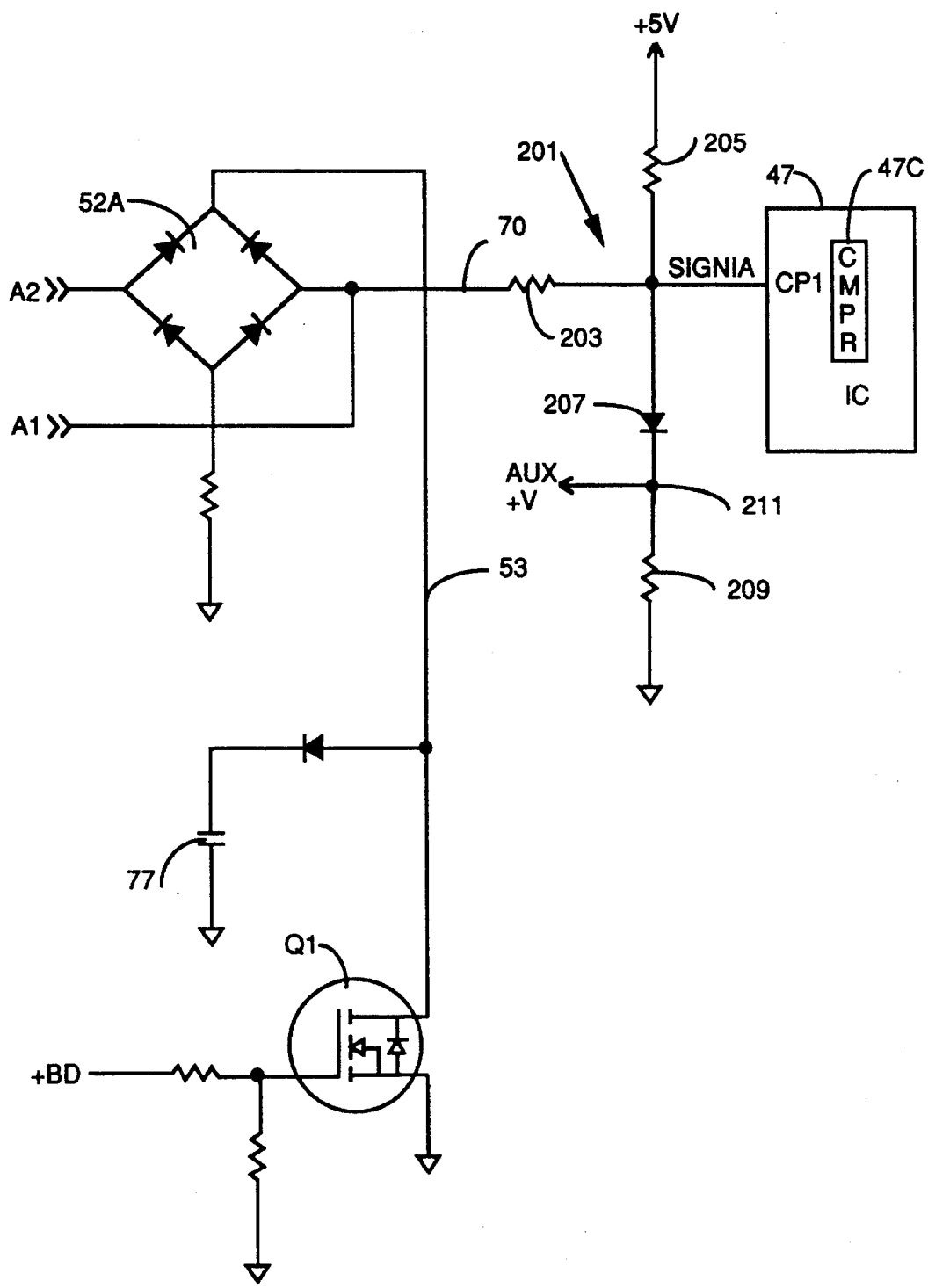
FIG. 3 is a schematic circuit diagram of another embodiment of a portion of the trip unit of FIGS. 2A–2F.

The signal SIGNIA in addition to being used by the IC 47 to determine the frequency of the distribution system current, is also used to determine the sign of phase A. This is needed because the A/D converter 47A in the IC 47 can only convert signals of one polarity. However, the filter 71 introduces a phase shift into the signal SIGNIA. While this phase shift is acceptable for the protection functions, it introduces an unacceptable error in the energy and power calculations. Thus, while the filter 71 can be used for a circuit breaker which only performs the protection functions, it is not usable for a circuit breaker which also calculates energy and power. Under the latter circumstances, the filter 71 is replaced by the circuit shown in FIG. 3. The circuit of FIG. 3 provides that a change in the sampling frequency can only be made while auxiliary power is present. The circuit 201 includes a large resistor 203 (1 meg in the exemplary circuit) in the lead 70 through which the phase A ac signal is applied to the CP1 input of the IC 47. As discussed above, the IC 47 compares the SIGNIA signal with a reference voltage to determine zero crossings of phase A and the sign of phase A. A resistor 205 connected to the +5 volt digital power source provides a bias to set the operating point at which a comparator within the IC switches. The resistor 205 is also of a large value (2.7 meg ohms in the exemplary circuit). The CP1 input of the IC 47 is also connected through a diode 207 and a resistor 209 to ground. A 5 volt AUX+V signal is applied to the junction 211 between the cathode of the diode 207 and the resistor 209.

When auxiliary power is present, it will be recalled from above that the chopper Q1 is turned on continuously. With the chopper Q1 on continuously, them is no noise to interfere with the counting of the zero crossings. Also under this condition, the AUX+V auxiliary source back biases the diode 207 and the SIGNIA signal may be read by the IC 47 for determining zero crossings for the frequency selection function.

On the other hand, when the auxiliary power is not present, the chopper Q1 turns on and off to maintain a voltage of approximately 40 volts on the capacitor 77. Under these conditions, AUX+V equals zero volts, diode 207 is forward biased, and because the resistor 203 is much larger than the resistor 209, the SIGNIA signal applied to the CP1 input of IC 47 is below the reference voltage. Thus, without auxiliary power present, the sampling interval cannot be changed. This is not a serious detriment, in that a previous determination of the sampling interval will continue to be used until the auxiliary power is again present.

The microprocessor 47P incorporated in the IC 47 uses the current signals representative of the phase and neutral currents supplied through the resistors 63A–63C to provide instantaneous, short delay and long delay protection in accordance with the protection characteristics discussed above. As mentioned, the protection for the neutral conductor is separately adjustable from the phase protection in a manner to be discussed below.

When the overcurrent-time limits are exceeded, the microprocessor 47P on the IC generates a TRIP signal on lead 73. This trip signal turns on a FET 75 which provides a path for discharge through a lead 76 of the capacitor 77 in the power supply 54 to actuate the flux shunt trip device 17 connected to the connection 79 on the extender board 49 which in turn opens the contacts 19. A fly back diode 78 is provided across the shunt trip device. The microprocessor also generates signals INST, SHORT, NEUTRAL, and LONG on leads 81, 83, 85 and 87, respectively. These signals are latched by a latch 89 for energization of INST, SHORT, and LONG, LEDs 91, 93, 95 and 97 which provide a visual indication of the cause of trip. If the trip was caused by an overcurrent in one of the phase conductors, one of the LEDs 91, 93, or 97 will be energized. If the overcurrent occurred in the neutral conductor, the neutral LED 95 will be energized.

The microprocessor 47P also generates alarm signals which provide notice of a condition which could lead to a trip. Thus, an LDALARM signal is generated on the lead 99 if the circuit breaker has tripped on a long delay. This signal is provided at a connection 101 on the extender board 49 for turning a remote alarm if desired. The microprocessor 47P generates a HLALARM signal on a lead 103 when a current reaches a percentage, for instance 85%, of the pick-up value for a long delay trip. This signal is provided to the HILOAD ALARM connection 105 on the extender board 49. The microprocessor 47P also generates an SCALARM signal on a lead 107 as a short circuit alarm indicating that an instantaneous trip has been generated. This signal is provided to the SHCK ALRM connection 109 on the extender board. A NEUTRAL ALARM signal is generated on the lead 110 when an operator selectable neutral current high threshold level, which is less than the pick-up current for neutral long delay protection is exceeded. Alternatively, the neutral alarm can be generated when any of the neutral protection pick-up values are exceeded. This signal is available at the output 112 on the extender board. The zener diodes 114 protect the IC 47 from any surges from circuits connected to the alarm outputs.

The digital trip unit 15 also can provide zone interlocking as is known in the art. Zone interlocking is provided in connection with the short delay protection in order to coordinate tripping of upstream and down stream circuit breakers in a manner which is well known. The short delay zone interlock out signal is provided by the microprocessor on lead 111 connected to the extender board 49 at the SOUTX connection 113. The short delay zone interlock input signal is input on lead 115 to the microprocessor from the SINX connection 117 on the extender board 49.

The digital trip unit 15 can be used with various frame sizes of circuit breakers. In addition, each of the frame sizes of circuit breakers with which the digital trip unit 15 is compatible can be used to protect an electrical system 3 in which the maximum continuous current permitted is less than or equal to the maximum continuous current permitted by the frame. In order to provide this information to the digital trip unit 15, a suitable, removable rating plug 119 can be plugged into the digital trip unit. The rating plug 119 contains a number of resistors (not shown) which are keyed to the frame size, and which set the maximum or rated current for the particular installation. This rated current can be the maximum current allowed by the frame size or some smaller value. For instance, if the maximum current allowed by the frame is 2,000 amperes, the resistor combination in the plug 119 can be selected to indicate to the microprocessor that the rated current is 2,000 amperes, 1,500 amperes, 1,200 amperes, or any other value less than 2,000 amperes. The microprocessor 47P reads the FRAME setting through a dedicated input MUX5 and reads the rated current through dedicated input MUX6.

The rating plug 119 also contains a battery (not shown) which provides a 3 volt source of power +E. As indicated previously, the digital trip unit 15 is powered by current from the protected circuit. When the circuit breaker trips and the current is interrupted, the power to the microprocessor is also interrupted, assuming the auxiliary power has not been provided. The three volt dc power +E provided by the battery on the rating plug 119 is applied to the latch 89 so that the cause of trip LEDs 91, 93, 95, and 97 remain energized following a trip. This battery is also used to provide, through the connection +E, power for a reset button 121 which generates a reset signal for the latch 89.

When the power to the microprocessor 47P is lost upon tripping of the circuit breaker, the calculation of the thermal state of the load represented by the $I^2t$ characteristic maintained by the long delay trip function is also lost, again assuming that auxiliary power is not provided. As is known in the art, the voltage representative of the thermal excitation state of the load, as represented by the I²t value, is stored on an external capacitor 125. In the exemplary digital trip unit 15, the capacitor 125 continuously tracks the thermal excitation state signal generated by the microprocessor. When the circuit breaker trips, and the microprocessor 47P becomes unpowered, the capacitor 125 discharges through a resistor 127. The value of resistor 127 is selected so that the voltage on the capacitor 125 discharges at a rate which mimics cooling of the load. When the microprocessor 47P becomes repowered, it utilizes the residual voltage on the capacitor 125 to set an initial value for the continued calculation of the thermal excitation state of the load.

A status LED 129 is energized intermittently by the microprocessor 47P to provide a status indication that the microprocessor is operational. The digital trip unit 15 self test can be initiated by depressing a test button 131.

The settings for the various protection functions are input to the microprocessor through a data bus 135. Connected to the data bus is a first set of operator adjustable switches 137 for adjusting the parameters for phase protection, a second set of switches 139 for setting neutral protection, and a switch 141 for setting the test parameters. The first set of switches 137 for setting phase protection includes: a switch 143 for setting the long delay pick-up level for phase protection, a switch 145 for setting the long delay time, a switch 147 for setting the short delay pick-up level for phase protection, a switch 149 for setting the short delay time, and a switch 151 for setting the instantaneous pick-up level.

The second set of switches 139 includes a switch 153 for setting the long delay pick-up level for neutral protection, and switch 155 for setting the threshold level for the neutral high load alarm. Each of the switches 141–155 has eight selectable settings. The settings of the switches 141–155 are read by the IC 47 through the data bus 135. The IC ports PB0–PB7 determine which switch is to be read. The port connected to the switch to be read is set to ground so that the wiper of that switch is grounded. The ports connected to the remaining switches are set to a high impedance so that the wipers of those switches are pulled up to +5 volts by the associated pull-up resistor 136. The ports PD1–PD7 read in the wiper position of the interrogated switch in parallel. The terminal engaged by the wiper will be at ground. All of the remaining terminals on the interrogated switch are pulled-up to +5 volts by the associated resistors 138.

Figure 4:
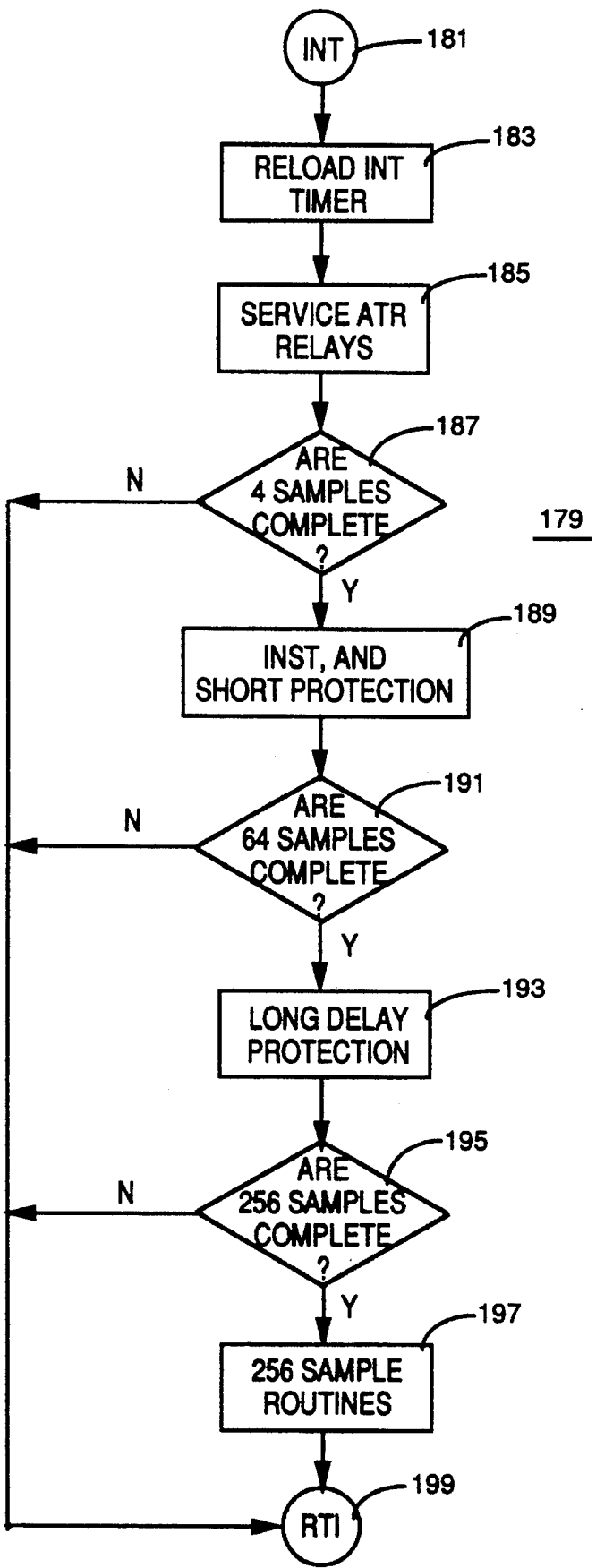
FIG. 4 is a flow chart of a suitable computer program utilized by the trip unit of FIGS. 2A–2F to implement the invention.

FIG. 4 illustrates the flow chart of the interrupt protection routine implemented by the microprocessor on the IC 47. This interrupt protection routine 179 is called at 181 approximately every 4 milliseconds, or four times per cycle. Upon being called, the routine first sets the timer at 183 to implement the next interrupt, and then services the ATR relays such as the neutral alarm relay 21 at 185. Each time four samples have been completed, as determined at 187, the instantaneous and short delay protection calculations are made at 189. After each 64 samples, as determined at 191, long delay protection is calculated at 193. Every 256 samples, as determined at 195, other related routines such as calculation of energy and power and the frequency of the source current are implemented at 197. In each case, the routine returns at 199 to the calling routine.

Various sampling schemes can be used for digitizing the voltages and currents. The exemplary circuit breaker 1 utilizes the sampling scheme described in allowed U.S. patent application Ser. No. 07/915,171, filed on Jul. 15, 1992, covering an energy monitoring system. In accordance with that scheme, sampling is performed in groups of 8 samples, each of which is referred as an octave. Within each octave, or group of 8 samples, odd numbered samples are taken 90 electrical degrees of the sampled waveform after the preceding even numbered sample, and even numbered samples are taken 112.5 electrical degrees after the preceding odd numbered sample. Between octaves there is a delay of 98.4 electrical degrees. After a succession of 16 octaves, for a total of 128 samples, the sampling process is repeated with a delay of 120.94 electrical degrees. This sampling scheme results in an average sampling interval of 5.0625 ms for a 60 Hz sine wave and 6.075 ms for a 50 Hz sine wave.

In determining the frequency of the ac power of the distribution system to which the circuit breaker is connected for use in setting the sampling interval, the microprocessor 47P counts the zero crossings of the phase A current. As a first defense against false selection of an interval due to extraneous zero crossings, the number of zero crossings must be within 1 or 2 of the number of crossings for an undistorted sign wave of the other frequency. As this calculation is made every 256 samples, the number of samples required to change the frequency selection is determined as follows. If the sampling rate is currently set for 60 Hz, the average sample interval as indicated above is 5.0625 ms and 256 samples will occur in 1296.0 ms. The number of positive going 60 Hz zero crossings in this time period is 77.75. On the other hand, the number of positive going 50 Hz zero crossings in this time period is 64.8. To allow for some error, a determination is made that the connected source is a 50 Hz source if the zero crossings equal 63, 64, 65 or 66. At 50 Hz, the average sample interval is 6.075 ms for the exemplary sampling scheme, and the 256 samples will occur in 1555.2 ms. The number of positive going 50 Hz crossings in this time period is 77.75 while the number of positive going 60 Hz crossings in this time period is 93.3. Therefore, if the crossings equal 92, 93, 94 or 95, a transfer is made to the 60 Hz interval.

Figure 5:
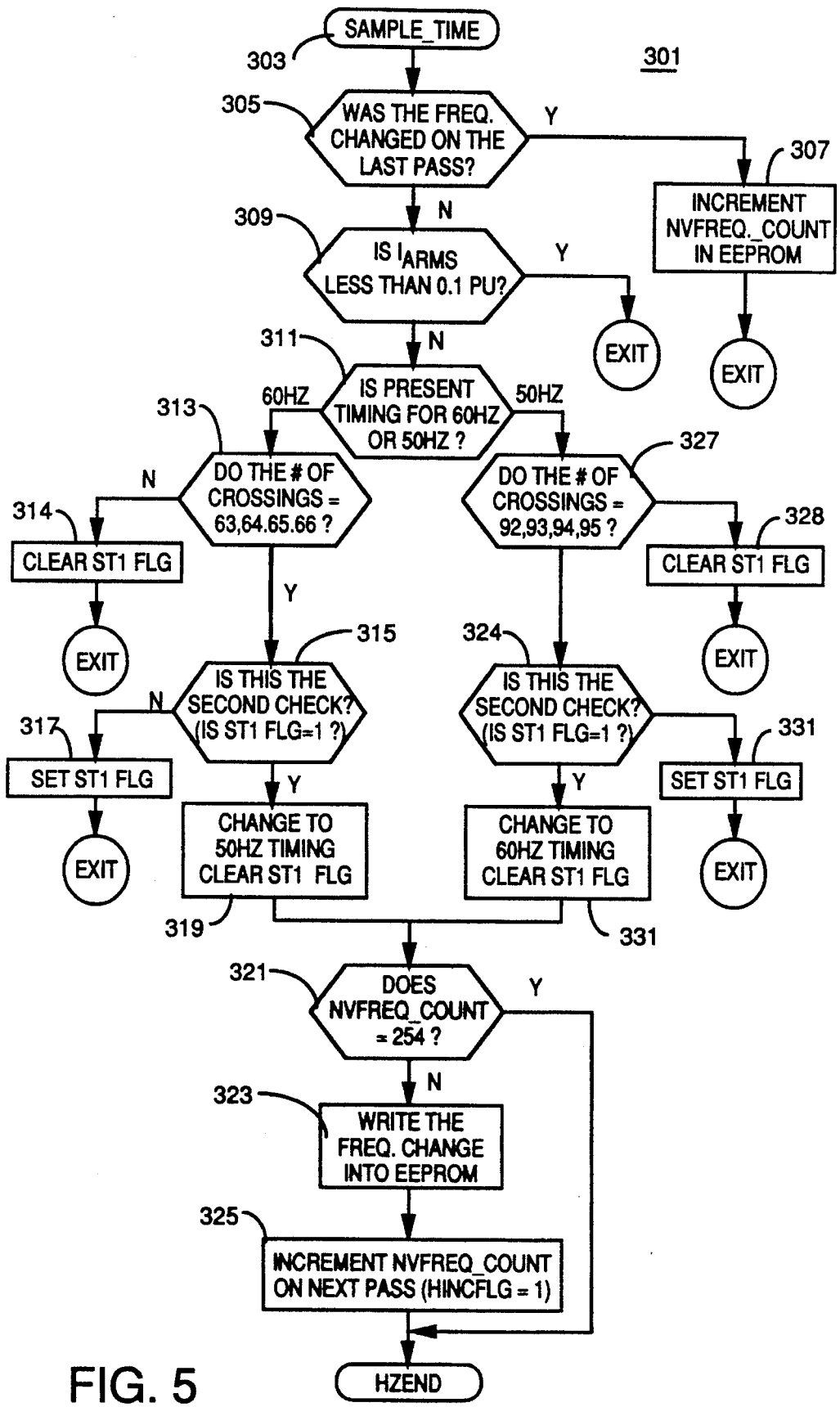
FIG. 5 is a flow chart of a subroutine used by the computer program charted in FIG. 4 to perform frequency selection in accordance with the invention.

FIG. 5 illustrates the timing selection Routine 301 implemented by the microprocessor 47P of the PC47. This routine is called at 303 about once every second. If it is determined at 305 that the frequency was changed the last time the routine was run, a count NVFREQ_count stored in the EEPROM is incremented at 307 and the routine is exited. Actual incrementing of the count is implemented by a called routine (not shown), since changing the value in the non-volatile memory takes time.

If the frequency was not changed on the last pass, but the phase A rms current at 309 is below a threshold valve, such as 0.1 pu, as determined by another routine which sets a zero count flag, the routine is also exited. When the phase A current is above the threshold, and the 60 Hz interval is being used, as determined at 311, the program is exited after resetting a flag ST1 AT 314 if the number of zero crossing counted during the last 256, 60 Hz sample intervals is not 63, 64, 65 or 66 as determined at 313. If the zero crossings is within this range, indicating that the source is 50 Hz rather than 60 Hz, and this is the first such indication as determined at 315, a flag ST1 is set at 317 before the routine is exited. On the next pass when the count is determined to again be either 63, 64, 65 or 66 at 313, and the flag is read as set at 315, the timing interval selection is changed to 50 Hz at 319 and the flag is cleared. If the maximum number of writeovers into EEPROM of the frequency selection has not been reached as determined at 321, the 50 Hz selection is written into the EEPROM at 323 and a flag is set at 325 to increment the NVFREQ count at 307 on the next pass. If the maximum number of rewrites to EEPROM (255 in the example) has been reached when checked at 321, the routine ends without writing to EEPROM. Notice, however, that the change was made at 319. This change is stored in RAM and is used by the microprocessor 47p. The consequence of not writing the change in the timing interval to the EEPROM is that if power is lost, the last change written into EEPROM, which may or may not be correct, will be used by the microprocessor 47p when it is repowered. However, after two 256 sample intervals, the system will switch to the currently observed correct sampling interval.

If the timing interval being used when checked at 311 is the 50 Hz interval, the routine exits after resetting flag ST1 AT 328 unless the number of zero crossings counted during 256 samples as observed at 327 is 92, 93, 94 or 95 indicating that 60 Hz power is connected to the circuit breaker. The first time this occurs as determined at 329, the flag ST1 is set at 331 so that the next time through the timing interval is set to the 60 Hz interval and the flag is reset at 331. Again, this new interval is used by the microprocessor and recorded in the EEPROM unless the maximum number of rewrites has been reached.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Electrical apparatus for connecting a load to either of a 50 Hz power source and a 60 Hz power source, said apparatus comprising:

separable contacts selectively connecting said load to a selected one of said 50 Hz power source and said 60 Hz power source when closed and disconnecting the load from the selected power source when open;

sensing means sensing current flowing through said separable contacts to the load when said contacts are closed;

digital control means including digitizing means digitally sampling said current sensed by said sensing means at selectable time intervals to generate digital current signals, and means responsive to predetermined values of said digital current signals to generate a trip signal;

means setting said selectable interval either to a first interval for a 50 Hz source or a second interval for a 60 Hz source and comprising zero crossing counting means generating a count of zero crossings of said current and means changing said selectable interval from said first interval to said second interval when said count during a first predetermined time period is within a first preselected number of zero crossings of a first number of zero crossings produced by an undistorted 60 Hz source during said first predetermined time period, and changing said selectable interval from said second interval to said first interval when said count within a second predetermined time period is within a second preselected number of zero crossings of the number of zero crossing produced by an undistorted 50 Hz source during said second predetermined time period;

means responsive to a trip signal to open said contacts; and wherein said means changing said selectable interval only changes said interval from said first interval to said second interval when said count is within said first preselected number of zero crossings of said first count during a designated number of said first predetermined time periods, and only changes said interval from said second interval to said first interval when said count is within said second preselected number of zero crossings of said second count during said designated number of said second predetermined time periods, wherein said means setting said selectable interval includes an EEPROM in which the interval selectable is written for use by said digitizing means upon powering up of said digital control means and means blocking said means changing said selectable interval from further writing of said selected interval into said EEPROM after said selectable interval has been written into said EEPROM a predetermined number of times.

2. Electrical apparatus for connecting a load to either of a 50 Hz power source and a 60 Hz power source, said apparatus comprising:

separable contacts selectively connecting said load to a selected one of said 50 Hz power source and said 60 Hz power source when closed and disconnecting the load from the selected power source when open;

sensing means sensing current flowing through said separable contacts to the load when said contacts are closed;

digital control means including digitizing means digitally sampling said current sensed by said sensing means at selectable time intervals to generate digital current signals, and means responsive to predetermined values of said digital current signals to generate a trip signal;

means setting said selectable interval either to a first interval for a 50 Hz source or a second interval for a 60 Hz source and comprising zero crossing counting means generating a count of zero crossings of said current and means changing said selectable interval from said first interval to said second interval when said count during a first predetermined time period is within a first preselected number of zero crossings of a first number of zero crossings produced by an undistorted 60 Hz source during said first predetermined time period, and changing said selectable interval from said second interval to said first interval when said count within a second predetermined time period is within a second preselected number of zero crossings of the number of zero crossing produced by an undistorted 50 Hz source during said second predetermined time period;

means responsive to a trip signal to open said contacts; and wherein said digital control means includes chopper means regulating dc power provided to said digital control means and which generates noise affecting said zero crossing counting means generating a count of zero crossings of said current, and filter means connected to said zero crossing counting means to filter out said noise generated by said chopper means.

3. The apparatus of claim 2 wherein said filter is at least a two pole filter tuned to filter said noise generated by said chopper.

4. The apparatus of claim 3 wherein said means setting said selectable time interval is disabled by disabling said means generating said count of zero crossings of said current.

5. Electrical apparatus for connecting a load to either of a 50 Hz power source and a 60 Hz power source, said apparatus comprising:

separable contacts selectively connecting said load to a selected one of said 50 Hz power source and said 60 Hz power source when closed and disconnecting the load from the selected power source when open;

sensing means sensing current flowing through said separable contacts to the load when said contacts are closed;

digital control means including digitizing means digitally sampling said current sensed by said sensing means at selectable time intervals to generate digital current signals, and means responsive to predetermined values of said digital current signals to generate a trip signal;

means setting said selectable interval either to a first interval for a 50 Hz source or a second interval for a 60 Hz source and comprising zero crossing counting means generating a count of zero crossings of said current and means changing said selectable interval from said first interval to said second interval when said count during a first predetermined time period is within a first preselected number of zero crossings of a first number of zero crossings produced by an undistorted 60 Hz source during said first predetermined time period, and changing said selectable interval from said second interval to said first interval when said count within a second predetermined time period is within a second preselected number of zero crossings of the number of zero crossing produced by an undistorted 50 Hz source during said second predetermined time period;

means responsive to a trip signal to open said contacts; and wherein said digital control means includes means supplying dc control power to said digital control means from an auxiliary source, and internal power supply means generating alternative dc control power from said current and including chopper means regulating said alternative dc control power and generating noise which affects said means generating a count of zero crossings of said current, said digital control means further including disabling means responsive to absence of control power from said auxiliary source for disabling said means setting said selectable time interval.

6. Electrical apparatus for controlling electrical power in a load, where the electrical power comprises an electrical current with an actual frequency which may be either of two values, comprising:

zero crossing sensing means for sensing the zero crossings within limits of said electrical current;

frequency determining means for initially generating an estimated frequency substantially equal to one of said two values;

comparison means interconnected with said zero crossing sensing means and said frequency determining means for comparing an interval related to said estimated frequency with the number of said zero crossings and indicating:

that said actual frequency is substantially equal to said estimated frequency if the number of said zero crossing within limits when compared with said interval is equal to a first number, that said actual frequency is substantially lower than said estimated frequency if the number of said zero crossings within limits when compared with said interval is equal to a second number, that said actual frequency is substantially higher than said estimated frequency if the number of said zero crossings within limits when compared with said interval is equal to a third number, said comparison means resetting said frequency determining means to said lower of said two values upon the occurrence of said second number, said comparison means resetting said frequency determining means to said higher of said two values upon the occurrence of said third number, the occurrence of said first number confirming that said estimated frequency is substantially said actual frequency;

activity sensing means for sensing activity in a component of said electrical power; and actuating means interconnected with said frequency determining means and said activity sensing means for causing an action as a function of the occurrence of a predetermined level of said activity and the presence of said actual frequency.

7. A circuit interrupter for interrupting electrical current which has an actual frequency which may be either of two values, zero crossing sensing means for sensing the zero crossings within limits of said electrical current;

frequency determining means for initially generating and estimated frequency substantially equal to one of said two values;

comparison means interconnected with said zero crossing sensing means and said frequency determining means for comparing an interval related to said estimated frequency with the number of said zero crossings and indicating:

that said actual frequency is substantially equal to said estimated frequency if the number of said zero crossings within limits when compared with said interval is equal to a first number, that said actual frequency is substantially lower than said estimated frequency if the number of said zero crossings within limits when compared with said interval is equal to a second number, that said actual frequency is substantially higher than said estimated frequency if the number of said zero crossings within limits when compared with said interval is equal to a third number, said comparison means resetting said frequency determining means to said lower of said two values upon the occurrence of said second number, said comparison means resetting said frequency determining means to said higher of said two values upon the occurrence of said third number, the occurrence of said first number confirming that said estimated frequency is substantially said actual frequency;

current sensing means for sensing the occurrence of a predetermined level of said current; and separable main contact means interconnected with said frequency determining means and said current sensing means for opening as a function of the occurrence of said predetermined level and the presence of said actual frequency.

8. The combination as claimed in claim 7, wherein said lower of said two values is 50 Hz.

9. The combination as claimed in claim 7, wherein said higher of said two values is 60 Hz.

10. The combination as claimed in claim 7, wherein said first number is substantially 77.75 within limits, said second number is in a range between 63 and 66, and said third number is in a range between 92 and 95.

* * * * *